United States Patent
Kanno

(10) Patent No.: US 7,760,780 B2
(45) Date of Patent: Jul. 20, 2010

(54) LASER DIODE DRIVING DEVICE AND OPTICAL SCANNING DEVICE

(75) Inventor: Takashi Kanno, Kashiwa (JP)

(73) Assignee: Canon Kabushiki Kaisha (JP)

( * ) Notice: Subject to any disclaimer, the term of this patent is extended or adjusted under 35 U.S.C. 154(b) by 22 days.

(21) Appl. No.: 12/169,363

(22) Filed: Jul. 8, 2008

(65) Prior Publication Data

US 2009/0016394 A1 Jan. 15, 2009

(30) Foreign Application Priority Data

Jul. 9, 2007 (JP) ............................. 2007-179915

(51) Int. Cl.
*H01S 3/00* (2006.01)
(52) U.S. Cl. .................. 372/38.02; 372/38.1
(58) Field of Classification Search .............. 372/38.02, 372/38.1
See application file for complete search history.

(56) References Cited

U.S. PATENT DOCUMENTS 6,292,497 B1 * 9/2001 Nakano .................. 372/29.015
6,370,175 B1 * 4/2002 Ikeda et al. ................. 372/38.1
2003/0219051 A1 * 11/2003 Hsieh ....................... 372/38.02
2004/0188717 A1 * 9/2004 Ono ............................ 257/200
2007/0030176 A1 * 2/2007 Sanchez-Olea et al. ....... 341/13
2008/0002747 A1 * 1/2008 Ono ......................... 372/38.02
2008/0304527 A1 * 12/2008 Gao et al. ................ 372/38.02

FOREIGN PATENT DOCUMENTS

JP 62-237786 A 10/1987
JP 11-245444 A 9/1999
JP 2005-64132 A 3/2005

\* cited by examiner

*Primary Examiner*—Minsun Harvey
*Assistant Examiner*—Phillip Nguyen
(74) *Attorney, Agent, or Firm*—Rossi, Kimms & McDowell LLP

(57) ABSTRACT

A laser diode driving device capable of obtaining a stable pulse emission state even when variation in the current-light amount characteristic of a laser diode thereof is caused by environmental changes. A photodiode detects the amount of light emitted from the laser diode. A laser controller determines the amount of light to be emitted from the laser diode. Further, the laser controller controls the laser diode to emit light in the determined light amount. A bias current value-determining section determines a bias current value based on results of light emission performed by the laser diode in three or more kinds of light amounts determined by the laser controller.

10 Claims, 7 Drawing Sheets

FIG. 3

| S/H CONTROL SIGNAL 29 | DATA OUTPUT CONTROL SIGNAL 30 | S/H CIRCUIT 27 | OUTPUT SELECTION CIRCUIT 38 | LASER DRIVING CIRCUIT 21 /OPERATION STATE |
|---|---|---|---|---|
| L | H | SAMPLING | FORCIBLE OUTPUT | LIGHT AMOUNT CONTROL (APC) |
| H | H | HOLDING | STOP | FORCIBLE LASER OFF |
| H | L | HOLDING | DATA OUTPUT | DATA OUTPUT |
| L | L | "0" (INITIAL VALUE) | STOP | RESET STATE |

LASER DIODE DRIVING DEVICE AND OPTICAL SCANNING DEVICE

BACKGROUND OF THE INVENTION

1. Field of the Invention

The present invention relates to a laser diode driving device and an optical scanning device.

2. Description of the Related Art

There has been proposed a technique related to a laser diode driving device, in Japanese Patent Laid-Open Publication No. H11-245444, in which the value of a bias current to be applied to a laser diode is determined based on two amounts of laser emission and current values corresponding to the respective amounts of laser emission.

However, the conventional technique has a problem with a method of calculating the bias current to be applied to the laser diode.

A laser diode, particularly a VCSEL (semiconductor vertical-cavity surface-emitting laser) sometimes has a current-light amount characteristic which assumes an extreme value as shown in FIG. 6. In a case where the current-light amount characteristic assumes an extreme value, when a threshold current value Ithc of the laser diode is calculated based on the two amounts of laser emission and the current values corresponding thereto, the threshold current value Ithc deviates from an actual threshold current value Ith by $\Delta I$ as shown in FIGS. 7A and 7B.

A bias current value Ib is calculated based on the obtained threshold current value Ithc, and hence the value Ib to be set close to the target value Ith deviates therefrom. When the bias current value deviates from the target value, the light emitting characteristics of the laser become unstable. For example, when the laser is used in an optical communication apparatus, troubles occur in data transmission. Further, when the laser is used in an image forming apparatus, variation occurs in output of highlight-side density depending on the environment.

SUMMARY OF THE INVENTION

The present invention provides a laser diode driving device and an optical scanning device which are capable of obtaining a stable pulse emission state even when variation in the current-light amount characteristic of a laser diode thereof is caused by environmental changes.

In a first aspect of the present invention, there is provided a laser diode driving device comprising a light amount-detecting unit adapted to detect an amount of light emitted from a laser diode, a light amount-determining unit adapted to determine an amount of light to be emitted from the laser diode, a light amount control unit adapted to control the laser diode to emit light in the light amount determined by the light amount-determining unit, and a bias current value-determining unit adapted to determine a bias current value based on results of tight emission performed by the laser diode in three or more light amounts determined by the light amount-determining unit.

In a second aspect of the present invention, there is provided an optical scanning device comprising a light amount-detecting unit adapted to detect an amount of light emitted from a laser diode, a light amount-determining unit adapted to determine an amount of light to be emitted from the laser diode, a light amount control unit adapted to control the laser diode to emit light in the light amount determined by the light amount-determining unit, and a bias current value-determining unit adapted to determine a bias current value based on results of light emission performed by the laser diode in three or more light amounts determined by the light amount-determining unit.

The laser diode driving device and the optical scanning device are provided with the light amount-detecting unit adapted to detect the amount of light emitted from a laser diode, the light amount-determining unit adapted to determine the amount of light to be emitted from the laser diode, and the light amount control unit adapted to control the laser diode to emit light in the light amount determined by the light amount-determining unit. Further, the devices have the bias current value-determining unit adapted to determine a bias current value based on results of light emission performed by the laser diode in three or more light amounts determined by the light amount-determining unit.

With this configuration, a stable pulse emission state can be obtained even when variation in the current-light amount characteristic of the laser diode is caused by environmental changes.

The features and advantages of the invention will become more apparent from the following detailed description taken in conjunction with the accompanying drawings.

BRIEF DESCRIPTION OF THE DRAWINGS

FIG. 3 is a table of laser control modes performed by the laser diode driving device in FIG. 1.

DETAILED DESCRIPTION OF THE EMBODIMENTS

The present invention will now be described in detail with reference to the drawings showing an embodiment thereof.

Figure 1:
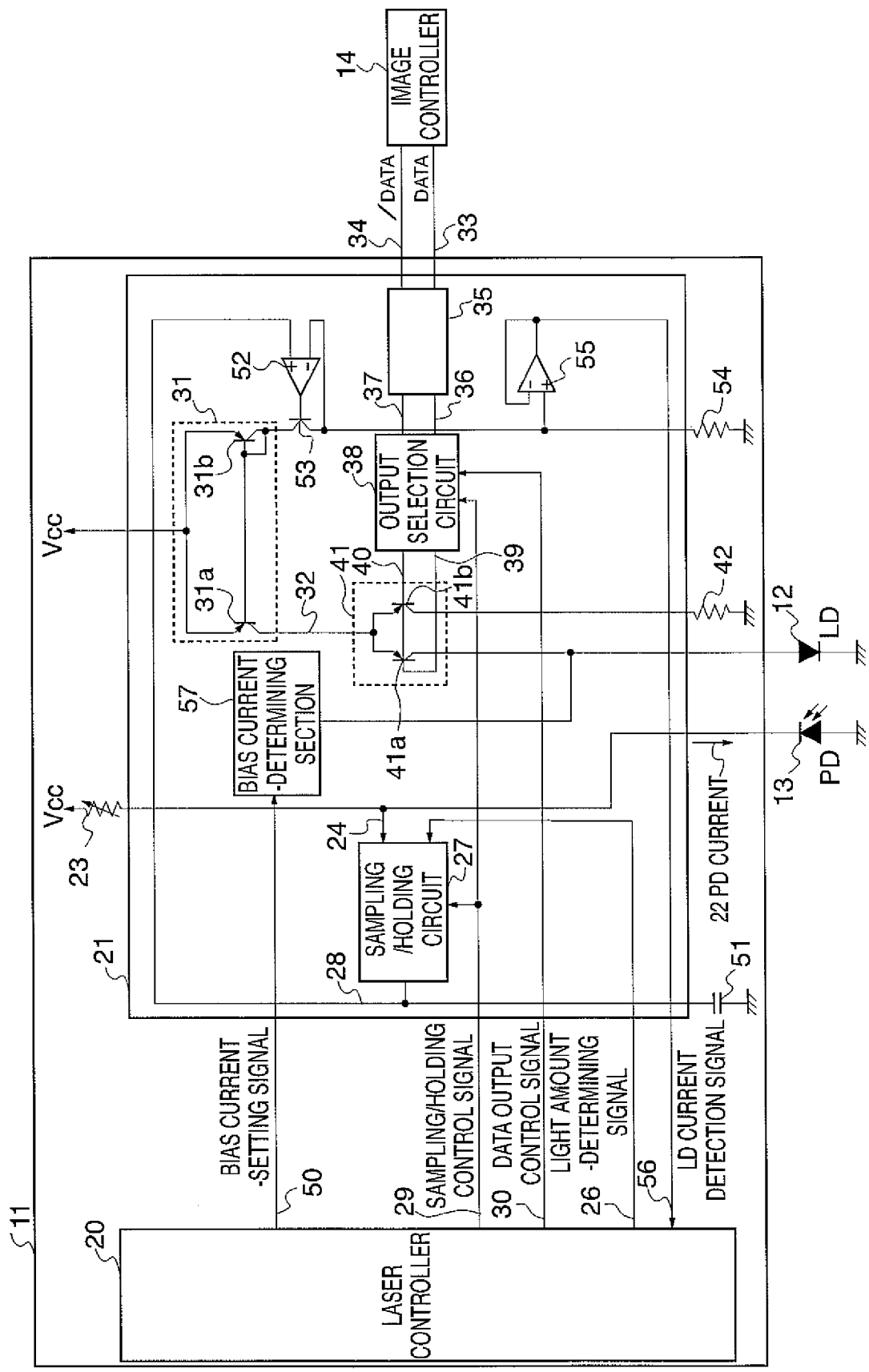
FIG. 1 is a block diagram of a laser diode driving device according to an embodiment of the present invention.

FIG. 1 is a block diagram of a laser diode driving device according to the embodiment of the present invention.

Connected to the laser diode driving device 11 are a semiconductor laser (laser diode: hereinafter abbreviated as "the LD") 12, a photodiode (hereinafter abbreviated as "the PD") 13, and an image controller 14.

The laser diode driving device 11 is comprised of a laser controller 20 and a laser driving circuit 21. A drive current to be supplied to the LD 12 is controlled by the laser driving circuit 21, whereby the LD 12 is caused to constantly emit a predetermined amount of light.

The laser controller 20 functions as a light amount-determining unit for determining the amount of light to be emitted from the LD 12. The laser controller 20 also functions as a light amount control unit for controlling the LD 12 so as to cause the same to emit an amount of light determined by the light amount-determining unit.

The PD 13 as a light amount-detecting unit for monitoring a laser beam output from the LD 12 (i.e. detecting the amount of light from the laser diode) outputs an electric current corresponding to the light amount of the monitored laser beam. A light amount-adjusting variable resistor 23 performs adjustment such that the LD 12 emits a predetermined amount of light.

The electric current (PD current) 22 output from the PD 13 according to the light amount of the monitored laser beam is converted into voltage by the light amount-adjusting variable resistor 23 and is output as a PD voltage signal 24. The PD voltage signal 24 is input to a sample/hold circuit 27 together with a light amount-determining signal 26 output from the laser controller 20.

When a sample/hold (hereinafter abbreviated as S/H) control signal 29 output from the laser controller 20 requests sampling, the sample/hold circuit 27 makes a comparison between the PD voltage signal 24 and the light amount-determining signal 26.

Then, when the PD voltage signal 24 is lower than the light amount-determining signal 26, the PD voltage signal 24 is charged in a hold capacitor 51, whereas when the PD voltage signal 24 is higher than the light amount-determining signal 26, the PD voltage signal 24 is discharged from the hold capacitor 51. Thus, a voltage value 28 dependent on the PD current 22 output from the PD 13 is caused to increase or decrease, whereby the LD 12 is controlled to the predetermined amount of light.

When the S/H control signal 29 requests holding, the voltage value 28 determined based on a result obtained depending on the PD current 22 when sampling was requested is held in the hold capacitor 51.

A current mirror circuit 31 as a current control circuit is comprised of transistors 31a and 31b. The mirror ratio of the current mirror circuit 31 is set to e.g. approximately 40. When data output is requested, the voltage value 28 output from the sample/hold circuit 27, which is dependent on the PD current 22 output from the PD 13, is input to the positive input terminal of an operational amplifier 52 in response to the S/H control signal 29 input from the laser controller 20. As a consequence, an electric current output from the emitter of a transistor 53 flows through a resistor 54.

It should be noted that the value of voltage generated across the resistor 54 is output as an LD current detection signal 56 to the laser controller 20 via an operational amplifier 55. Since the mirror ratio of the current mirror circuit 31 is set to approximately 40, a laser drive current 32 output from a collector side of the transistor 31a of the current mirror circuit 31 becomes approximately 40 times larger than the current flowing through the resistor 54.

A differential receiver (LVDS) 35 having a differential input receives a non-inverted data signal 33 and an inverted data signal 34 each input from the image controller 14. An output selection circuit 38 outputs a first switching signal 39 or a second switching signal 40 determined by the S/H control signal 29 or a data output control signal 30.

A current driver 41 has transistors 41a and 41b and is configured as a differential amplifier by connecting emitter terminals of the respective transistors 41a and 41b to each other. The transistor 41a switchingly drives the LD 12 based on the first switching signal 39, using the laser drive current 32. Similarly, the transistor 41b switchingly drives a load resistor 42 based on the second switching signal 40, using the laser drive current 32.

A bias current-determining section 57 outputs an electric current according to a bias current-setting signal 50 such that the ratio of a value of a bias current supplied to the LD 12 to a laser threshold current value Ith of the LD 12 or the amount of the bias current does not change.

The function of the bias current-determining section 57 as a bias current value-determining unit will be described in more detail.

The bias current-determining section 57 determines a bias current value based on the values of respective electric currents applied to the LD 12 when the LD 12 is caused to emit light in two different amounts.

Further, the bias current-determining section 57 determines a bias current value through comparison between bias current values obtained from the values of the respective electric currents applied to the LD 12 when the LD 12 is caused to emit light in the two different amounts.

Furthermore, the bias current-determining section 57 determines a bias current value based on the values of respective electric currents applied to the LD 12 when the LD 12 is caused to emit light in two amounts except a maximum amount which are selected from a three or more amounts.

Now, various kinds of laser control modes performed by the laser diode driving device 11 in FIG. 1 will be described with reference to FIGS. 2 and 3.

(1) When the laser diode driving device 11 is in a laser control mode in which the laser driving circuit 21 is set to perform automatic light amount control ("APC (Automatic Power Control)), and the sample/hold circuit 27 is in a sampling state, the output selection circuit 38 forcibly outputs ON data to cause the LD 12 to emit light, irrespective of a receiver non-inverting output signal 36 and a receiver inverting output signal 37 output from the LVDS 35, to thereby perform, using a signal corresponding to a difference between the PD voltage signal 24 and the light amount-determining signal 26, control for adjusting the amount of light emitted from the LD 12 to a predetermined light amount as follows:

In the case of PD voltage signal 24>light amount-determining signal 26: It is determined that the light emission amount of the LD 12 is larger than the predetermined light amount, and the hold capacitor 51 is discharged. As a consequence, the voltage value 28 dependent on the PD current 22 output from the PD 13 is lowered to reduce the laser drive current 32, whereby the light emission amount of the LD 12 is reduced.

In the case of PD voltage signal 24<light amount-determining signal 26: It is determined that the light emission amount of the LD 12 is smaller than the predetermined light amount, and the hold capacitor 51 is charged. As a consequence, the voltage value 28 dependent on the PD current 22 output from the PD 13 is raised to increase the laser drive current 32, whereby the light emission amount of the LD 12 is increased.

In the case of PD voltage signal 24=light amount-determining signal 26: It is determined that the light emission amount of the LD 12 is equal to the predetermined light amount, and the hold capacitor 51 is neither charged nor discharged. As a consequence, both the voltage value 28 dependent on the PD current 22 output from the PD 13 and the laser drive current 32 are neither increased nor reduced.

(2) When the laser diode driving device 11 is in a laser control mode in which the laser driving circuit 21 is set to forcibly turn off the laser (OFF), and the sample/hold circuit 27 is in a holding state, the voltage value 28 set by the sample/hold circuit 27 depending on the PD current 22 output from the PD 13 is held, and the output selection circuit 38 forcibly outputs OFF data to turn off the LD 12 to stop light emission, irrespective of the receiver non-inverting output signal 36 and the receiver inverting output signal 37.

(3) When the laser diode driving device 11 is in a laser control mode in which the laser driving circuit 21 is set to output data (DATA OUTPUT), and the sample/hold circuit 27 is in the holding state, the output selection circuit 38 outputs a signal corresponding to the receiver non-inverting output signal 36 or the receiver inverting output signal 37, using voltage value 28 set by the sample/hold circuit 27 depending on the PD current 22 output from the PD 13, whereby an electric current is caused to flow through the LD 12 or the resistor 42.

(4) When the laser diode driving device 11 is reset, the laser driving circuit 21 is brought into a reset state, and the electric current set in the sample/hold circuit 27 is initialized, and at the same time, the output selection circuit 38 forcibly outputs OFF data to turn off the LD 12.

Figure 4:
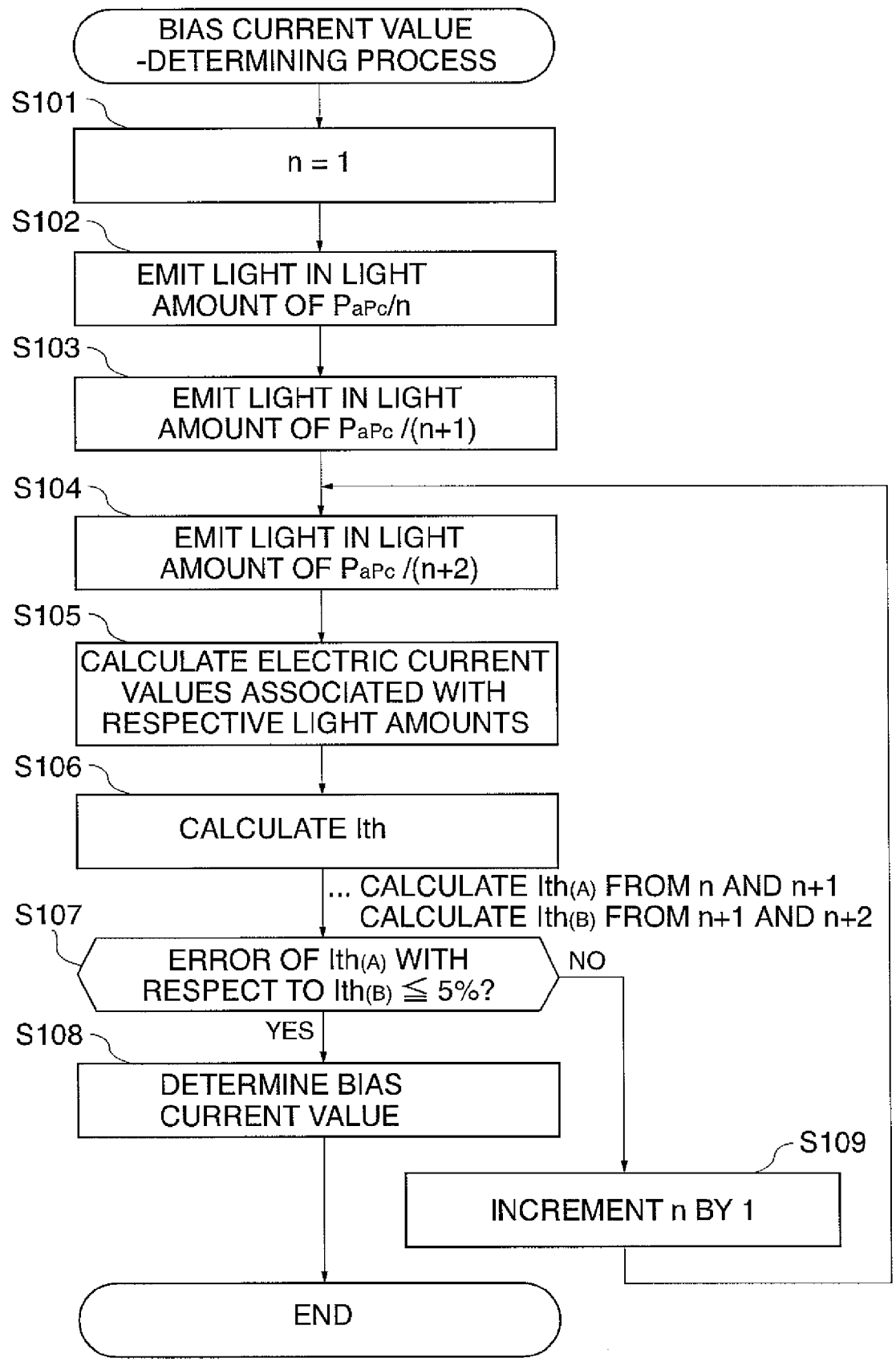
FIG. 4 is a flowchart of a bias current-determining process executed by the laser diode driving device in FIG. 1 so as to determine a bias current to be applied to an LD.

FIG. 4 is a flowchart of a bias current-determining process executed by the laser diode driving device in FIG. 1 so as to determine a bias current to be applied to the LD.

First, a description will be given of steps S101 to S105.

I. The above-mentioned automatic light amount control is executed so as to adjust the light emission amount of the LD 12 to a light amount $P_{aPc}$ for data light emission.

First in the step S101, n is set to 1, and then in a step S102, APC light emission is executed with the light amount $P_{aPc}$. Voltage having a value corresponding to the value of electric current applied to the LD 12 in this state is output between the resistor 54 and ground GND. At this time, the light amount-determining signal 26 is set to $V_{ref\text{-}aPc}$. When the resistance value of the resistor 54 is represented by $R_{54}$, and an electric current flowing through the LD 12 by $I_{aPc}$, a voltage $V_{54aPc}$ generated between the resistor 54 and the GND can be calculated by the following equation:

$$V_{54aPc} = I_{aPc} \times R_{54}/40 \qquad\qquad A$$

The voltage value of $V_{54aPc}$ is output to the laser controller 20 via the operational amplifier 55. In the step S105, the electric current $I_{aPc}$ is calculated from the equation A, and the calculated current value is stored in a memory of the laser controller 20. In this connection, the current value is calculated by the following equation:

$$I_{aPc} = 40 \times V_{54aPc}/R_{54}$$

II. APC is executed with a light amount $P_{aPc}/2$ which is half the light amount set in the stage I.

When the light amount-determining signal 26 is set to $V_{ref\text{-}aPc}/2$ in the step S103 so as to cause the LD 12 to emit light in the light amount $P_{aPc}/2$ which is half the light amount set in the stage I, the PD voltage signal 24 becomes higher than the light amount-determining signal 26, whereby the electric current flowing to the LD 12 is reduced as described in the case (1). A voltage V541/2aPc generated between the resistor 54 and the GND at this time can be calculated by the following equation:

$$V_{541/2aPc} = I_{1/2aPc} \times R_{54}/40 \qquad\qquad B$$

The voltage value of $V_{541/2aPc}$ is output to the laser controller 20 via the operational amplifier 55. In the step S105, the electric current $I_{1/2aPc}$ is calculated from the equation B, and the calculated current value is stored in the memory of the laser controller 20. Incidentally, the current value is calculated as follows:

$$I_{1/2aPc} = 40 \times V_{541/2aPc}/R_{54}$$

III. APC is executed with a light amount $P_{aPc}/3$ which is one third of the light amount set in the stage I.

When the light amount-determining signal 26 is set to $V_{ref\text{-}aPc}/3$ in the step S104 so as to cause the LD 12 to emit light in the light amount $P_{aPc}/3$ which is one third of the light amount set in the case I, the PD voltage signal 24 becomes higher than the light amount-determining signal 26, whereby the electric current flowing to the LD 12 is reduced as described in the case (1). A voltage V541/3aPc generated between the resistor 54 and the ground GND in association with current flowing through the LD 12 at the time can be calculated by the following equation:

$$V_{541/3aPc} = I_{1/3aPc} \times R_{54}/40 \qquad\qquad C$$

The voltage value of the voltage $V_{541/3aPc}$ is output to the laser controller 20 via the operational amplifier 55. In the step S105, the electric current $I_{1/3aPc}$ is calculated from the equation C, and the calculated current value is stored in the memory of the laser controller 20. In this connection, the current value is calculated by the following equation:

$$I_{1/3aPc} = 40 \times V_{541/3aPc}/R_{54}$$

Next, a description will be given of a step S106 for calculating the laser threshold current value Ith from the light amounts and the current values.

IV. The laser threshold current value Ith is calculated from the relationship between the light amounts P and the electric currents I associated with the LD 12, which are calculated in the stages I, II, and III.

A laser threshold current value Ith (A) is tentatively calculated from the relationship between the light amounts $P_{aPc}$, $P_{aPc}/2$, and $P_{aPc}/3$ and the electric currents $I_{aPc}$, $I_{1/2aPc}$, and $I_{1/3aPc}$ corresponding to the respective light amounts. Since the light amount P and the electric current I are calculated as $P_{aPc}$ and $I_{aPc}$ in the stage I and as $P_{aPc}/2$, and $I_{1/2aPc}$ in the stage II, the laser threshold current value Ith (A) can be calculated by the following equation:

$$Ith(A) = I_{aPc} - P_{aPc} \times (I_{aPc} - I_{1/2aPc})/(P_{aPc} - P_{aPc}/2) \qquad D$$

Then, a laser threshold current value Ith (B) is tentatively calculated from the relationship between the light amounts P and the electric currents I in the stages II and III. Since the light amount P and the electric current I are calculated as $P_{aPc}/2$ and $I_{1/2aPc}$ in the stage II, and as $P_{aPc}/3$ and $I_{1/3aPc}$ in the stage III, the laser threshold current value Ith (B) can be calculated by the following equation:

$$Ith(B) = I_{1/2aPc} - P_{aPc}/2 \times (I_{1/2aPc} - I_{1/3aPc})/(P_{aPc}/2 - P_{aPc}/3) \qquad E$$

Finally, a description will be given of steps S107 to S109.

V. The two laser threshold current values calculated in the stage IV are compared with each other to thereby determine a bias current to be applied to the LD 12.

Figure 5:
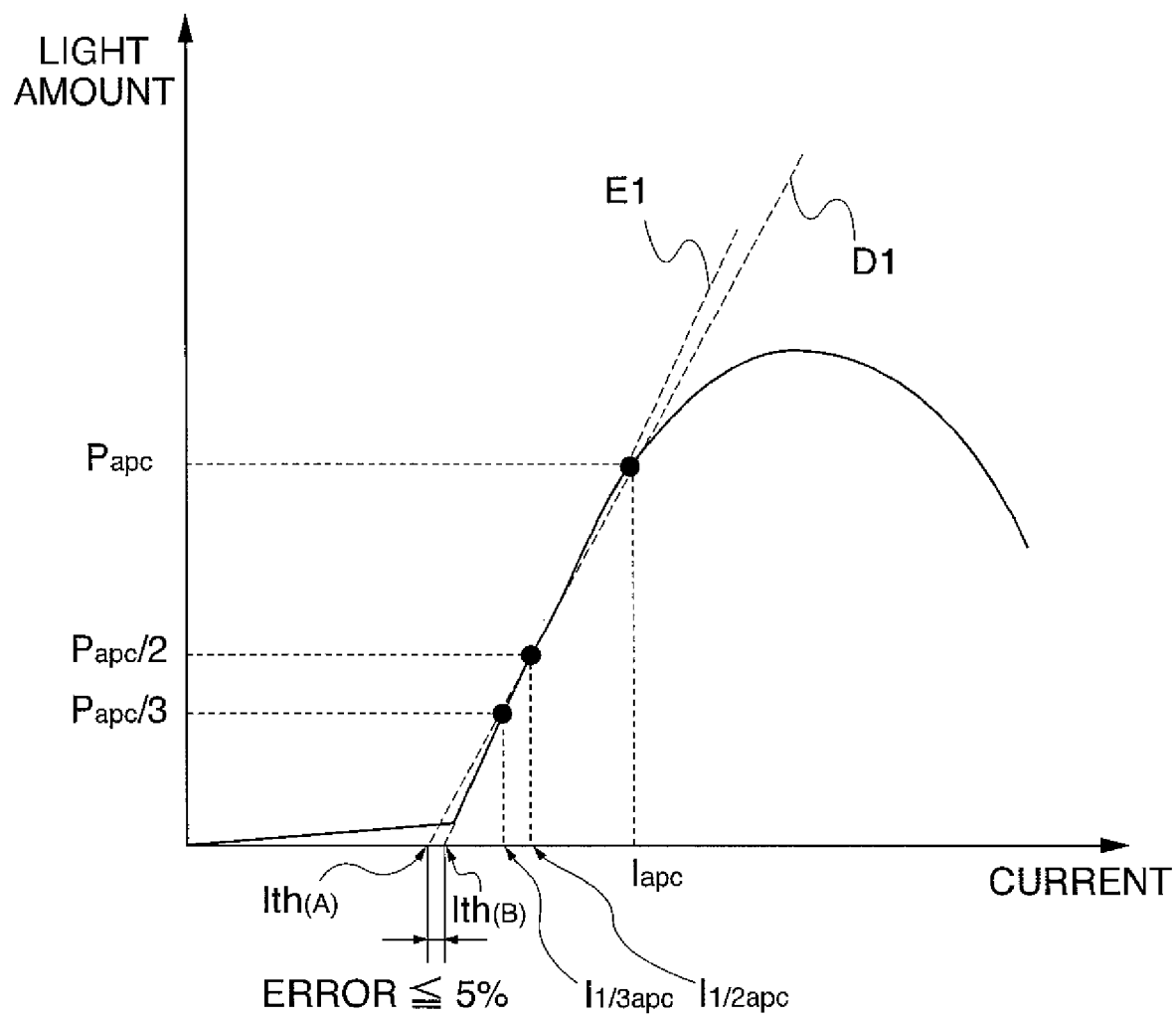
FIG. 5 is a diagram showing a characteristic of a semiconductor laser (laser diode) appearing in FIG. 1 (No. 1).

If it is determined in the step S107, based on the result of comparison between the laser threshold current values Ith (A) and Ith (B), that an error of Ith (A) with respect to Ith (B) is e.g. within 5%, it is judged that the relationship between the light amount and the electric current corresponds to that between linear expressions denoted by E1 and D1 in FIG. 5 (which means that the relationship between the light amount of which values are $P_{aPc}$, $P_{aPc}/2$, and $P_{aPc}/3$ and the current of which respective associated values are $I_{aPc}$, $I_{1/2aPc}$, and $I_{1/3aPc}$ can be expressed by a single linear expression). In this case, it can be said that the calculated laser threshold current value Ith and the actual laser threshold current value Ith of the LD 12 are approximately identical in characteristic, and therefore in the step S108, the bias current value is determined using the laser threshold current value Ith (A).

Now, the reason for determining the bias current value using the laser threshold current value Ith (A) will be explained. The voltage $V_{54}$ generated between the resistor 54 and the GND is used as a value for use in calculating the laser threshold current value Ith, but when the light amount of the LD 12 is small, due to a low value of the voltage $V_{54}$, an error increases in the calculating the laser threshold current value Ith with high accuracy.

Another reason is that when the LD 12 is a VCSEL, the rated amount per se of light that can be emitted is small, and hence not only further reduction of the value of the voltage $V_{54}$, but also reduction of the output of the PD 13 occur, which causes an increase in error in the APC.

The bias current Ib is calculated in the step S108, provided that the bias current value is set to 90% of the laser threshold current value Ith (A), by the following equation:

$$Ib = 0.9 \times Ith(A)$$

Figure 6:
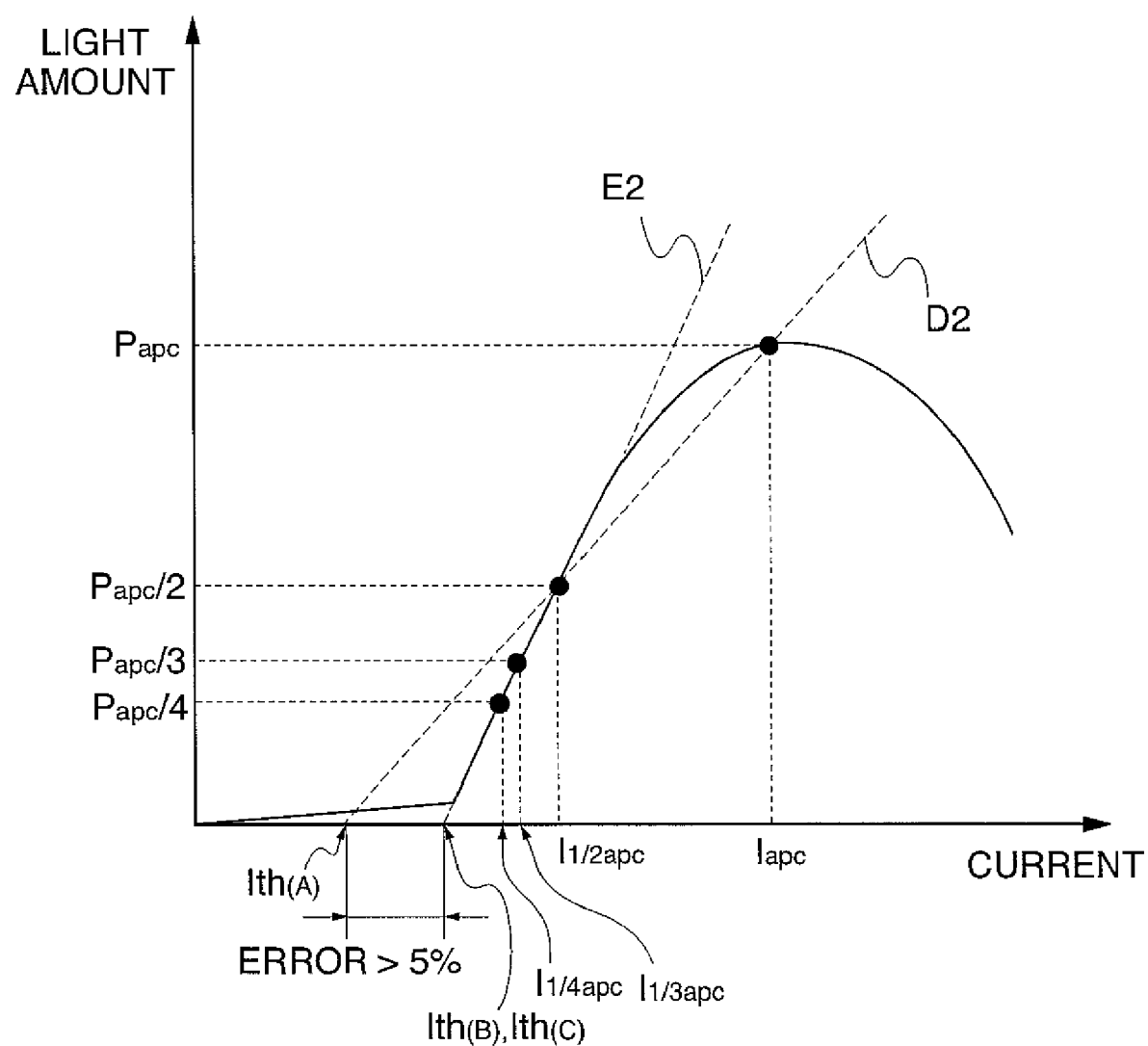
FIG. 6 is a diagram showing a characteristic of the semiconductor laser (laser diode) appearing in FIG. 1 (No. 2).
Figure 7A:
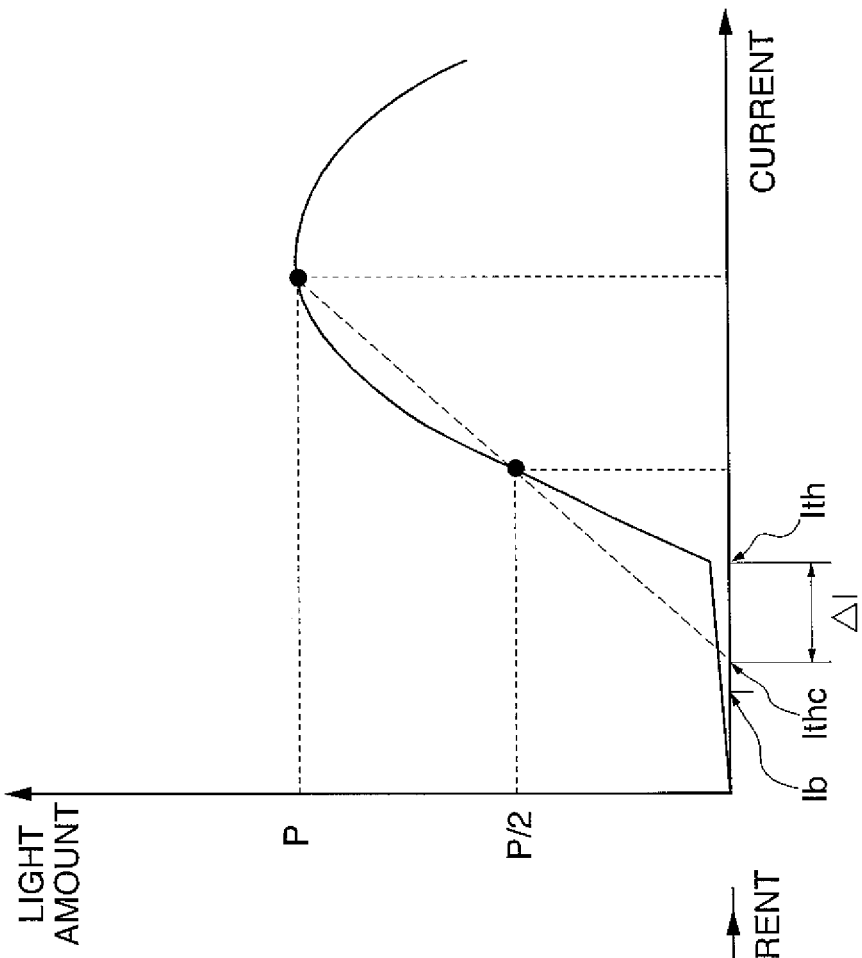
FIGS. 7A and 7B are diagrams showing characteristics of a conventional laser diode.
Figure 7B:
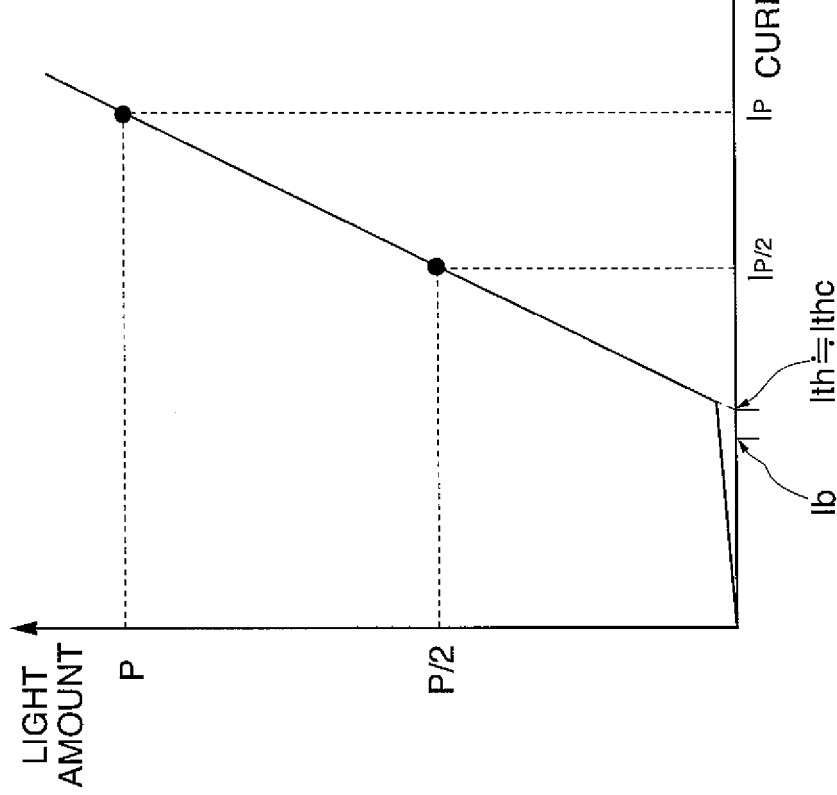

On the other hand, if it is determined in the step S107, based on the result of comparison between the laser threshold current values Ith (A) and Ith (B), that the error of Ith (A) with respect to Ith (B) is more than 5%, it is judged that the relationship between the light amount and the electric current corresponds to that between linear expressions denoted by E2 and D2 in FIG. 6 ((which means that the relationship between the light amount of which values are $P_{aPc}$, $P_{aPc}/2$, and $P_{aPc}/3$ and the current of which respective associated values are $I_{aPc}$, $I_{1/2aPc}$, and $I_{1/3aPc}$ cannot be expressed by a single linear expression). In this case, it can be said that the calculated laser threshold current value Ith and the actual laser threshold current value Ith of the LD 12 are largely different in characteristic.

Therefore, in the step S109, n is incremented by 1 so as to reduce the light amount to a lower level than the light amount $P_{aPc}/3$ in which light was emitted in the step S104, and then in the step S104, APC is executed with a light amount $P_{aPc}/4$ which is one forth of the light amount $P_{aPc}$. Then, in the step S106, a laser threshold current value Ith (C) is calculated from the light amounts $P_{aPc}/3$ and $P_{aPc}/4$ and the currents $I_{1/3aPc}$ and I1/4aPc corresponding to the respective light amounts. Further, in the step S107, the laser threshold current values Ith (B) and Ith (C) are compared in the same manner as described above, to thereby determine whether or not the error between the two values falls within 5%.

This step is repeatedly carried out until the error between the two values falls within 5%. By doing this, it is possible to set the bias current accurately even when the laser diode has a non-linear characteristic having a maximum output light amount on its non-linear portion as shown in FIG. 6.

Figure 2:
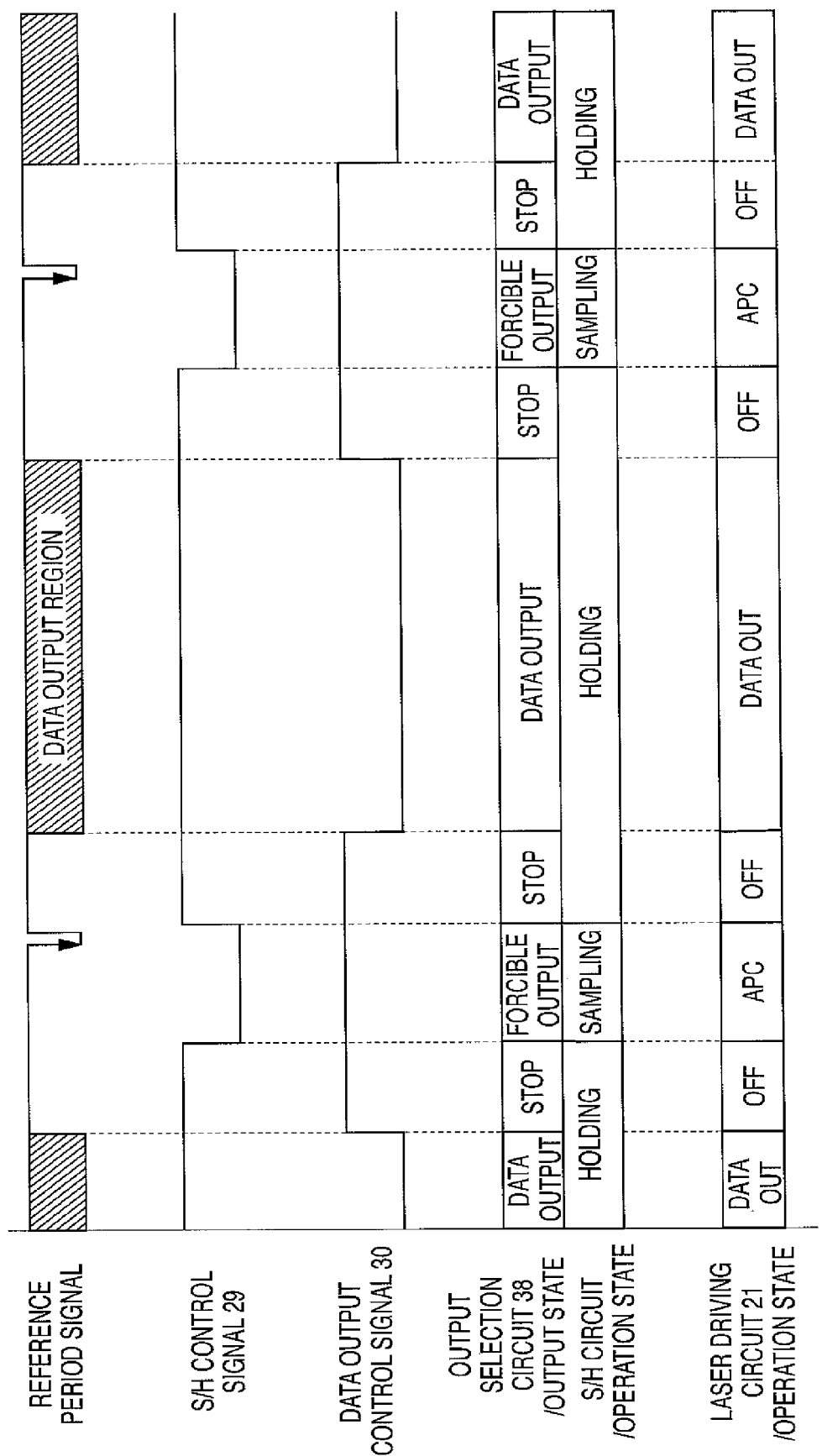
FIG. 2 is a timing diagram of a control sequence executed by the laser diode driving device in FIG. 1.

It should be noted that APC is always executed with the light amount $P_{aPc}$ during a time period over which the LD 12 performs data output, e.g. in sampling timing in FIG. 2 by way of example. Further, the steps S103 et seq. for determining the bias current value Ib may be carried out during a time period over which data output is not performed as in FIG. 2. In such a case, when n is set to 1 and it is determined in the step S107 that the error is more than 5%, and when the sequence for determining the bias current value Ib is to be operated again, the operation may be started by setting n to 2. Although in the present embodiment, control is performed for a single laser diode, it is possible to control a plurality of laser diodes.

As described heretofore, by calculating a bias current value from electric current values corresponding, respectively, to three or more kinds of light amounts of a laser diode, it is possible to set the bias current value Ib close to the threshold current value Ith of the laser diode even when the light amount-electric current characteristic is like the one shown in FIG. 6.

Therefore, trouble in data transfer in an optical communication apparatus or degradation of image quality in an image forming apparatus can be suppressed. Further, since the bias current value can be set close to the threshold current value Ith even when the light amount-electric current characteristic has no linear region, it is possible to perform precise light amount control e.g. even for a VCSEL (semiconductor vertical-cavity surface-emitting laser) having one or more light emitting points.

While the present invention has been described with reference to an exemplary embodiment, it is to be understood that the invention is not limited to the disclosed exemplary embodiment. The scope of the following claims is to be accorded the broadest interpretation so as to encompass all modifications, equivalent structures and functions This application claims priority from Japanese Patent Application No. 2007-179915 filed Jul. 9, 2007, which is hereby incorporated by reference herein in its entirety.

What is claimed is:

1. A laser diode driving device comprising:
    a light amount-detecting unit adapted to detect an amount of light emitted from a laser diode;
    a light amount-determining unit adapted to determine an amount of light to be emitted from the laser diode;
    a light amount control unit adapted to control the laser diode to emit light in the light amount determined by said light amount-determining unit; and
    a bias current value-determining unit adapted to determine a bias current value based on results of light emission performed by the laser diode in three or more light amounts determined by said light amount-determining unit,
    wherein said bias current value-determining unit determines the bias current value through comparison between (a) a first bias current value obtained from a first line calculated through two points corresponding to electric current values associated with two of the three or more light amounts, and (b) a second bias current value obtained from a second line calculated through two points corresponding to electric current values associated with two of the three or more light amounts, and
    wherein a point of the two points associated with the first line is different than a point of the two points associated with the second line.

2. A laser diode driving device as claimed in claim 1, wherein said bias current value-determining unit determines the bias current value based on electric current values of respective electric currents applied to the laser diode when the laser diode is caused to emit light in two different light amounts.

3. A laser diode driving device as claimed in claim 1, wherein said bias current value-determining unit determines the bias current value based on electric current values of respective electric currents applied to the laser diode when the laser diode is caused to emit light in two light amounts except a maximum light amount which are selected from a three or more light amounts.

4. A laser diode driving device as claimed in claim 1, wherein the laser diode is a semiconductor vertical-cavity surface-emitting laser.

5. A laser diode driving device as claimed in claim 1, wherein the laser diode is a semiconductor vertical-cavity surface-emitting laser having one or more light emitting points.

6. An optical scanning device comprising:
    a light amount-detecting unit adapted to detect an amount of light emitted from a laser diode;
    a light amount-determining unit adapted to determine an amount of light to be emitted from the laser diode;

a light amount control unit adapted to control the laser diode to emit light in the light amount determined by said light amount-determining unit; and a bias current value-determining unit adapted to determine a bias current value based on results of light emission performed by the laser diode in three or more light amounts determined by said light amount-determining unit, wherein said bias current value-determining unit determines the bias current value through comparison between (a) a first bias current value obtained from a first line calculated through two points corresponding to electric current values associated with two of the three or more light amounts, and (b) a second bias current value obtained from a second line calculated through two points corresponding to electric current values associated with two of the three or more light amounts, and wherein a point of the two points associated with the first line is different than a point of the two points associated with the second line.

7. An optical scanning device as claimed in claim 6, wherein said bias current value-determining unit determines the bias current value based on electric current values of respective electric currents applied to the laser diode when the laser diode is caused to emit light in two different light amounts.

8. An optical scanning device as claimed in claim 6, wherein said bias current value-determining unit determines the bias current value based on electric current values of respective electric currents applied to the laser diode when the laser diode is caused to emit light in two light amounts except a maximum light amount which are selected from a three or more light amounts.

9. An optical scanning device as claimed in claim 6, wherein the laser diode is a semiconductor vertical-cavity surface-emitting laser.

10. An optical scanning device as claimed in claim 6, wherein the laser diode is a semiconductor vertical-cavity surface-emitting laser having one or more light emitting points.

* * * * *